1/31/84 OR 4,429,247

United States Patent [19]

Feldman

[11] 4,429,247

[45] Jan. 31, 1984

[54] PIEZOELECTRIC TRANSDUCER SUPPORTING AND CONTACTING MEANS

[75] Inventor: Steven Feldman, Seminole, Fla.

[73] Assignee: AMP Incorporated, Harrisburg, Pa.

[21] Appl. No.: 343,680

[22] Filed: Jan. 28, 1982

[51] Int. Cl.[3] .............................................. H01L 41/08

[52] U.S. Cl. .................................... 310/322; 310/324; 179/110 A

[58] Field of Search ............... 310/322, 324, 316, 366; 179/110 A; 340/384 E

[56] References Cited

U.S. PATENT DOCUMENTS

| | | | |
|---|---|---|---|
| 3,007,013 | 10/1961 | Paull et al. | 179/110 A |
| 3,331,970 | 7/1967 | Dundon et al. | 310/9.1 |
| 3,704,385 | 11/1972 | Schweitzer et al. | 310/322 |
| 3,761,956 | 9/1973 | Takahashi et al. | 310/324 |
| 3,879,726 | 4/1975 | Sweany | 340/384 E |
| 4,056,741 | 11/1977 | Hoerz et al. | 310/322 |
| 4,063,049 | 12/1977 | Pipitone et al. | 179/110 A |
| 4,122,365 | 10/1978 | Stephens | 310/324 |
| 4,190,784 | 2/1980 | Massa | 310/324 |
| 4,230,383 | 10/1980 | Burnstein et al. | 339/17 R |
| 4,282,520 | 8/1981 | Shipp et al. | 340/384 E X |
| 4,292,561 | 9/1981 | Martin | 310/322 |
| 4,302,695 | 11/1981 | Boyles et al. | 310/322 X |

FOREIGN PATENT DOCUMENTS

| | | | |
|---|---|---|---|
| 2042820 | 9/1980 | United Kingdom | 310/322 |

*Primary Examiner*—Mark O. Budd
*Attorney, Agent, or Firm*—F. Brice Faller

[57] ABSTRACT

Nodal contacts for piezoelectric audio transducer comprise an annular surface in a conductive housing member which is attached resiliently to a circuit board. The transducer is clamped resiliently between the annular surface and first and second contacts mounted to the board. The first contact is situated on a semicircular wall which forms a resonant cavity and the second contact is situated on a post in an aperture defined by the wall. An alternative embodiment utilizes a plastic housing member with slots in the top thereof which allow resilience of the annular surface.

18 Claims, 5 Drawing Figures

10
12
14
19
20
3
17
18
24
3
24
13
15
27
26
26
28
23
25
30
36
28
27
31
50
46
52
53
47
54
61
41
49
66
65
59
63
50
48
46
47
60
62
46
40

PIEZOELECTRIC TRANSDUCER SUPPORTING AND CONTACTING MEANS

BACKGROUND OF THE INVENTION

The present invention relates to supporting and contacting means for a piezoelectric audio transducer, and particularly to nodal mounting means.

Piezoelectric audio transducers, also known as piezoceramic benders or benders, are enclosed in a housing or holder of some kind and the combination is known as a buzzer. Buzzers presently find use in telephones, electronic games, home appliances, smoke detectors, radar detectors, intrusion alarms, and medical equipment. The transducers are generally mounted in one of three ways: center mount, edge mount, and nodal mount. Nodal mounts are required when maximum sound pressure levels are to be achieved with the minimum transducer drive current since mounting of the transducer at its nodal diameter does not dampen oscillations. Center mounts and edge mounts produce a higher impedance and a lower frequency, and are used where mechanical considerations are more important than electrical, or where it is desirable to force the transducer to vibrate at a frequency lower than its resonant frequency.

Nodal or ring mounts employ a ring of a specific diameter where the natural vibration of the bender exhibits a node, which permits oscillations of greater amplitude than mounting at the outer edge, the center, or any other radius. Several buzzer manufacturers use an adhesive to mount the transducer to a ring in a housing, and the necessary electrical contacts are made by soldering fine wires to the opposite surface on the wafer of piezoelectric ceramic, and the metal surface surrounding the wafer. An alternative to soldered wire is a pressure contact employing resilient metal contacts extending from a housing member which mounts to the housing containing the ring. An example is a buzzer manufactured by BRK Electronics; this employs an adhesive ring mount on the node of the all-metal surface of the transducer, two resilient contacts against the ceramic on the node opposite the ring mount, and a third contact outside the node. An alternative nodal mounting scheme, exemplified by a buzzer manufactured by Molex, Inc., utilizes housing members with rings which bear against the node on opposite surfaces. Electrical contact is achieved by resilient contacts, mounted in one housing member, which bear against the surface having the ceramic. These are not nodal contacts, and thus have a damping effect on the vibration. Even fine wires soldered to the bender tend to dampen oscillations, which decreases efficiency and represents a costly hand operation in buzzer manufacture. It would be most desirable to have a mounting and contacting means in which the mounting and electrical contacts necessary to drive the buzzer could be achieved solely on the nodes for maximum acoustical performance.

SUMMARY OF THE INVENTION

The present invention provides a nodal mounting and contacting scheme with minimum damping. Two points of independent contact are circuit board and contact the transducer on isolated sections of the piezoelectric wafer. One of the contacts is situated on the top surface of a semicircular wall which forms a resonant cavity and the other is mounted in the aperture defined by the wall.

A conductive annular surface or ring contact borne by or an integral part of a housing bears against the opposite all-metal surface of the transducer and holds it against the board-mounted contacts. The housing is resiliently mounted to the board and has an orienting rib which mates with a notch in the edge of the transducer to establish angular orientation of the contacts and the sections of the piezoelectric wafer. Spacing ribs orient the contacts on the node and space it from the inside wall of the housing. An alternative embodiment utilizes a plastic housing having a top portion profiled with slots for resilience between the annular surface and legs which snap directly into the circuit board; one contact is located off the node at a point on the bender where resonant frequency is affected at a minimum.

The board-mounted contacts are particularly well suited to being die cast in metal such as zinc which is anchored through holes in the board and may form an integral part of circuit conductors.

DETAILED DESCRIPTION OF THE PREFERRED EMBODIMENT

Figure 1:
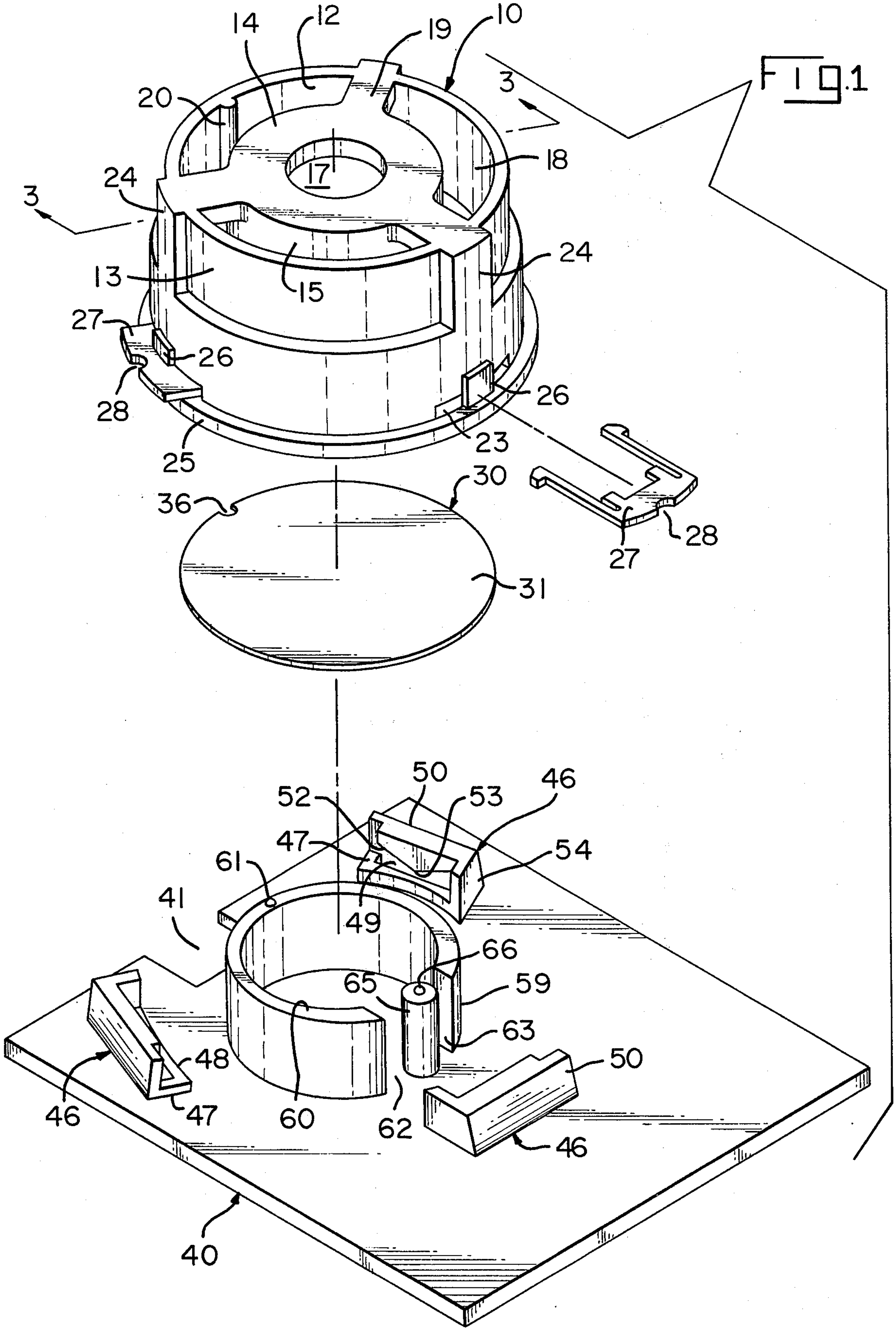
FIG. 1 is an exploded perspective.

FIG. 1 shows the housing 10 and transducer 30 exploded from the components mounted to circuit board 40, which include the coupling members 46, semicircular wall 59, and center post 65. Salient features of the housing 10 are the inner cylindrical surface 12, outer cylindrical surface 13, and top portion 14. The top portion 14 carries a tubular member 15 which is concentric with inner cylindrical surface 12. The top surface has an inner aperture 17 which communicates with the inside of tubular member 15, and outer apertures 18 which communicate with the space between the inner surface 12 and tubular member 15. The inner surface 12 has an orienting rib 20 thereon which cooperates with notch 36 in the transducer 30 as will be described. The outer surface 13 has hand grip ribs 24 thereon, a bottom flange 25, and locating keys 26 which hold leaf springs 27 in angular alignment around housing 10. A notch 28 in each leaf spring 27 serves a retaining and centering function with the respective coupling member 46 as will be described.

Referring still to FIG. 1, a semicircular wall 59 having a flat top surface 60 and parallel sidewalls 63 defining a gap 62 is mounted to board member 40, which is parallel to the plane of top surface 60. A first contact or stud 61 is situated on the top surface 60 directly across from the gap 62, and a second contact or stud 66 is situated on center post 65 which is mounted to board member 40 in the middle of gap 62. The studs 61, 66 are the same distance above the board member 40. Note that the semicircular wall 59 is widest at sidewalls 63; this is because the area of sidewalls 63 and volume therebetween are critical parameters in the design of an aperture for a resonant cavity for a piezoelectric audio transducer 30. The resonant cavity is the volume within the semicircular wall 59. An important feature of the wall 59 is that it is of the same diameter as the node exhibited by the natural vibration of the transducer 30.

Also depicted in FIG. 1 are three coupling members 46, each spaced the same distance from the center of semicircular wall 59 and spaced about 120° apart. Each coupling member 46 is characterized by a bottom plate 47 mounted to board member 40, and an outer wall 50 and end wall 54 which are perpendicular to bottom plate 47. The outer wall 50 has an inverted ramp member 52 integral therewith which has an apex 53 facing bottom plate 47. The bottom plates 47 have arcuate surfaces 48 facing inward which are profiled to closely receive the bottom flange 25, and core holes 49 which communicate with like profiled holes in the board member 40. The housing 10 is assembled to board member 40 by placing the transducer 30 in the housing 10 so that the rib 20 fits in notch 36, inserting springs 27 into slots 23 on each side of each locating key 26, placing the housing 10 over wall 59 such that extension 21 (FIG. 3) of rib 20 fits in cut-out 41 in board 40, and rotating the housing 10 so that leaf springs 27 slide under ramps 52 until the notches 28 mate with apices 53.

Figure 2:
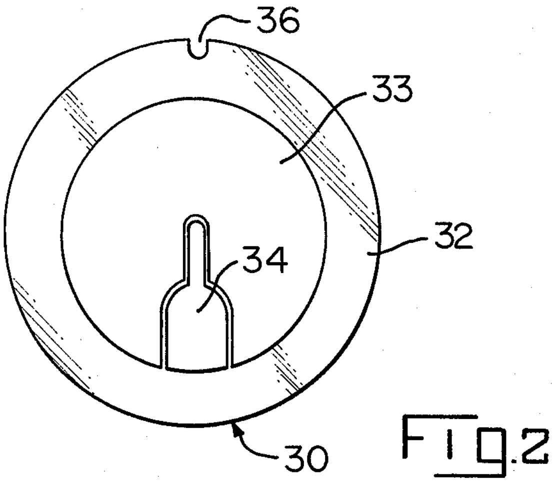
FIG. 2 is a plan view of a transducer.

FIG. 2 depicts the second surface 32 of transducer 30. This is a typical transducer design incorporating a wafer of piezoelectric ceramic 33 bonded to surface 32. A feedback portion 34 of like ceramic is isolated from the rest of the wafer 33. The transducer 30 is distinguished by notch 36 which receives orienting rib 20 (FIG. 1) in the housing 10; this assures that the feedback portion 34 will contact second contact or stud 66. The diameter of the wafer 33 is larger than that of the semicircular wall 59, which corresponds to the resonant node of the transducer, so that first contact or stud 61 will contact the wafer 33 on the node of the transducer 30.

Figure 3:
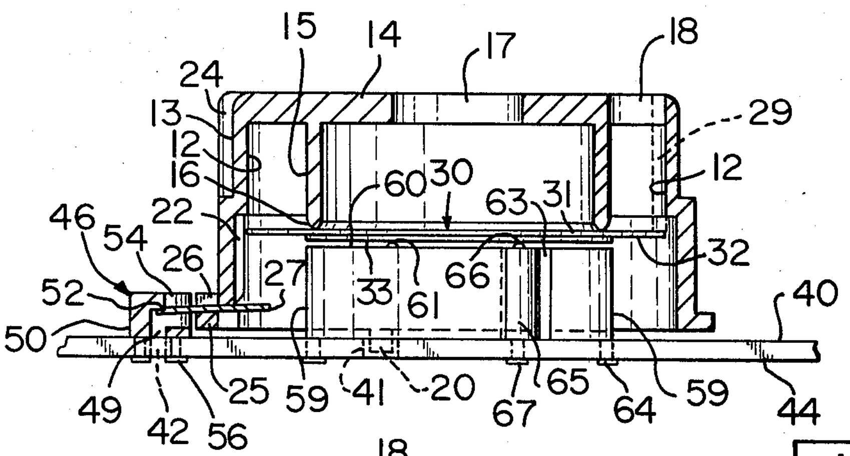
FIG. 3 is a side section of the assembly taken along line 3—3 of FIG. 1.

FIG. 3 is a cross section of the housing 10 as assembled to board 40 with the transducer 30 sandwiched against studs 61, 66. First surface 31 of the transducer 30 is borne against by annular surface 16 which defines the lower end of tubular member 15. The lower end of tubular member 15 has a beveled edge so that the annular surface 16 approximates a circular line. The diameter of the tubular member 15, like that of the semicircular wall 59, corresponds to the resonant node of the transducer. The contacting arrangement shown, being confined to the resonant node of the transducer, has a minimum damping effect when current is applied to the transducer and thus permits the greatest possible acoustic efficiency for a given resonant cavity design. The transducer 30 is spaced slightly from the inner surface 12 of housing 10 by spacing ribs 22 on the inner surface 12. The spacing ribs 22 have a lower profile than orienting rib 20 and serve only to center the transducer 30 so that annular surface 16 and studs 61, 66 contact the transducer on the resonant node. The ribs 22 are spaced about 120° apart opposite hand grip ribs 24 and define the perimeter of a circle only very slightly larger than the transducer, whereby centering of the transducer is accomplished without edge damping. Note that the leaf springs 27 are flexed slightly to resiliently mount the housing 10 to circuit board 40 and to clamp the transducer 30 between the annular surface 16 and studs 61, 66.

Referring still to FIG. 3, the coupling members 46, semicircular wall 59, and center post 65 are mounted to board member 40 by rivets 56, 64, and 67 respectively. These may be cast through using a metal such as zinc to manufacture the board-mounted components inexpensively. The core hole 49 and core hole 42 in the board 40 permit entry of a core member to form the ramp member 52. The housing 10 may be cast separately or a modified version stamped and formed from sheet metal. The rivets 56, 64, 67 are continuous with circuit traces cast on the bottom surface 44 of board member 40. Two independent points of electrical contact may be established for applying an alternating or pulsed direct current across the wafer, via annular surface 16 and first contact or stud 61, and a third point of electrical contact may be established for a feedback lead, via second contact or stud 66.

Figure 4:
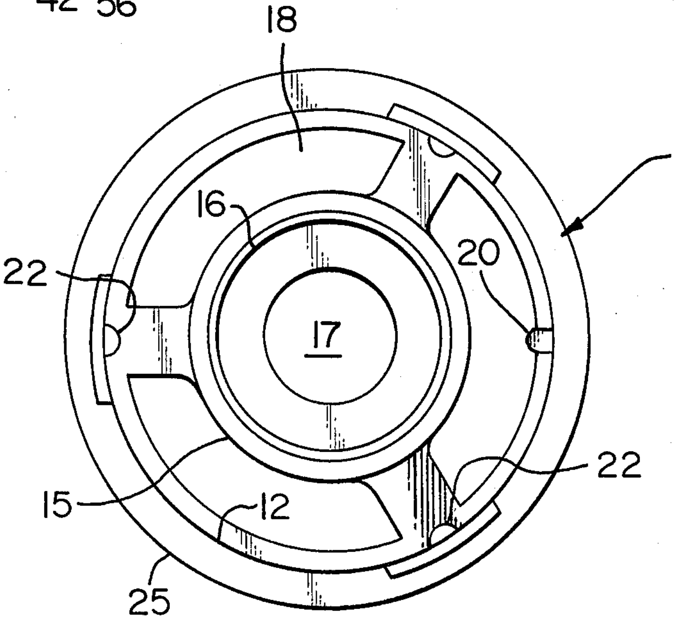
FIG. 4 is a plan view of the inside of the housing member.

FIG. 4 is a plan view of the inside of housing 10 and shows the orienting rib 20 and spacing ribs 22 to best advantage. The orienting rib 20 extends below the housing and enters cut-out 41 in the board member 40 (FIG. 1). This assures that the housing will mate to the coupling members 46 in only one orientation, to assure proper contact of studs 61, 66 with the wafer 33 and feedback portion 34 respectively.

Figure 5:
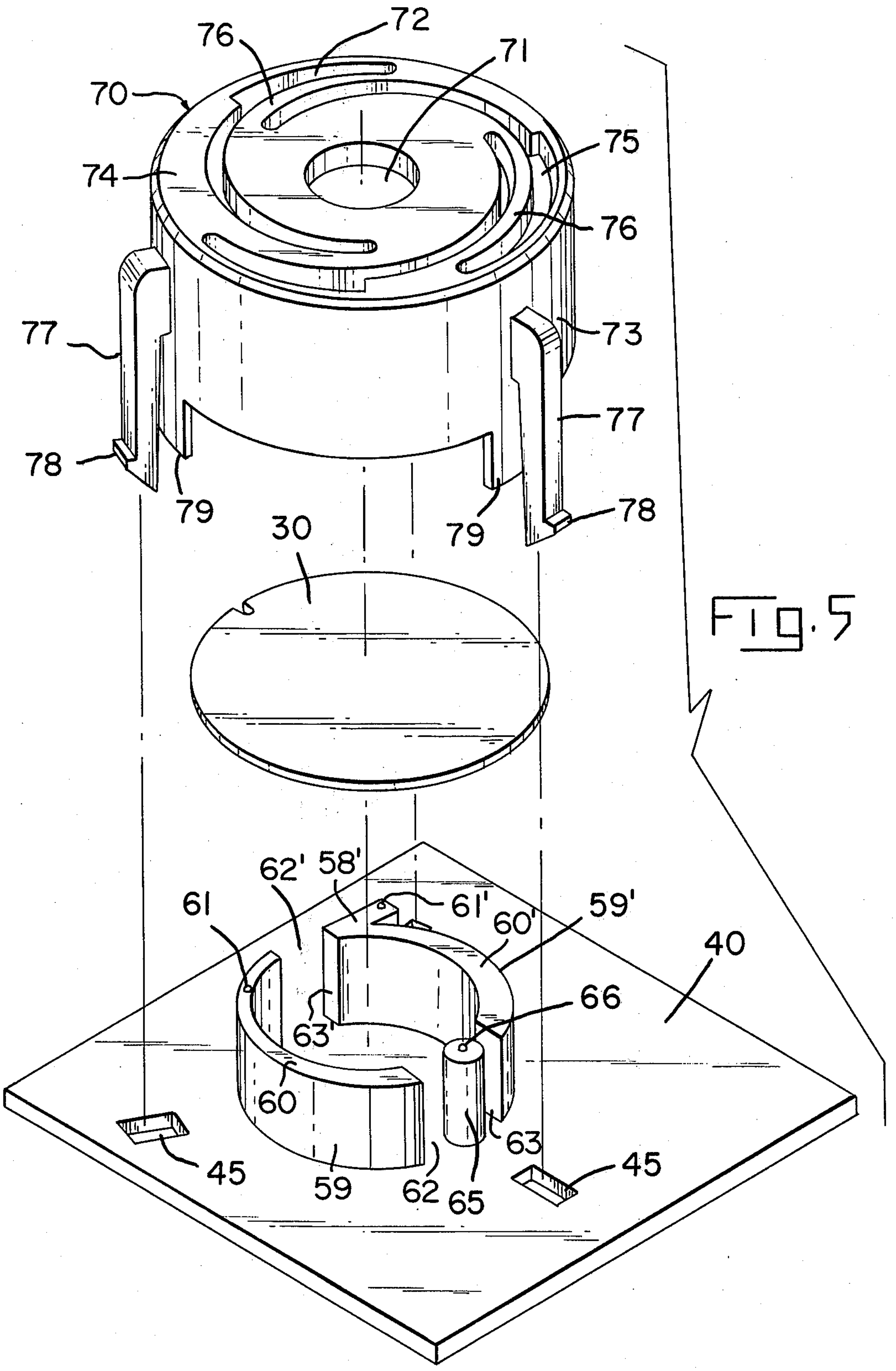
FIG. 5 is an exploded perspective of an alternative embodiment.

FIG. 5 shows an alternative embodiment of the invention which employs a different housing 70. The housing 70 is plastic and thus cannot provide electrical contact through the annular surface formed on the edge of the tubular member carried therein, which is structurally like member 15 of the first described embodiment. This embodiment comprises two electrically isolated semicircular walls 59, 59′ separated by gaps 62, 62′. Sidewalls 63, 63′ are dimensioned to collectively satisfy the equation for a Helmholtz resonator. Wall 59′ has an offset portion 58′ having a contact stud 61′ thereon which is slightly higher than studs 61, 66 (by the thickness of wafer 33) in order to contact second surface 32 outside the diameter of wafer 33 so that alternating or pulsed direct current can be applied across the wafer 33 while retaining post 65 for feedback purposes. This would dampen the vibration of the transducer slightly more than the nodal contacts, but if located as shown in FIG. 5 would have a negligible effect. Alternatively, the resilient plastic housing 70 may be metalized or otherwise made conductive by conductive fillers so that the tubular member in the housing may serve as a third electrical contact as in the first described embodiment, so that nodal contact only is possible.

The housing 70 of FIG. 5 is characterized by an inner cylindrical surface 72, an outer cylindrical surface 73, and a top portion 74 having overlapping arcuate slots 75 therein which define strips 76 therebetween. The strips 76 provide resilience between the inner surface 72 and the tubular member for clamping of the transducer between contacts 61, 66. Legs 77 on the outside 73 of the housing have latches 78 which snap resiliently into holes 45 in the board for retention. The bottom edge 79 of the housing 70 will be spaced above the board 40 by the spring action of the top portion 74 against the transducer. The bottom edge 79 prevents overtravel of housing 70 if the housing receives a blow or is otherwise mis-handled. Note that the slots 75 also act as apertures for the outer resonant cavity contained in the housing, while the hole 71 acts as the aperture for the inner resonant cavity contained by the tubular member. The board mount components shown for this and other embodiments may be soldered or mechanically fixed to the board as an alternative to being die cast.

The above described embodiments are exemplary and not intended to limit the scope of the claims which follow.

I claim:

1. Supporting and contacting means for a piezoelectric audio transducer, said transducer being in the form of a circular metal wafer having a first all metal surface and an opposed second surface having a piezoelectric ceramic bonded thereto, said supporting and contacting means being of the type comprising a housing having an annular surface therein, said annular surface contacting said first surface of said transducer, said supporting and contacting means further comprising first and second electrical contacts in contact with said second surface thereof, said supporting and contacting means being characterized in that said contacts are essentially point contacts and said transducer is supported by being clamped between said annular surface and said two electrical contacts, said electrical contacts providing the sole support for said second surface of said transducer, said housing being profiled to closely receive said transducer so that the annular surface is concentric relative to the outer edge of the transducer.

2. Supporting and contacting means as in claim 1 characterized in that said annular surface contacts said first surface on the node of the transducer.

3. Supporting and contacting means as in claim 2 wherein said annular surface approximates a circular line, whereby the damping effect of said surface on said transducer is minimized.

4. Supporting and contacting means as in claim 1 characterized in that said first electrical contact contacts said second surface on the node thereof, said node falling within the periphery of the piezoelectric ceramic.

5. Supporting and contacting means as in claim 4 characterized in that said second electrical contact contacts said second surface on the node thereof, said second contact serving as a feed-back contact.

6. The supporting and contacting means of claim 4 characterized in that said first contact is mounted on a semicircular wall having a top surface in a plane which parallels the transducers, said semicircular wall being fixed to a board member to which said housing is resiliently attached, said semicircular wall defining a gap where said wall is incomplete, said second contact being mounted on a center post fixed to said board member in said gap, said top surface generally paralleling the node of the transducer, whereby said semicircular wall forms a resonant cavity.

7. Supporting and contacting means as in claim 1 characterized in that said housing is conductive, said annular surface therein serving as a third electrical contact.

8. Supporting and contacting means as in claim 7 characterized in that first and second contacts and said housing are mounted to a board member, said board having a plurality of at least three coupling members fixed thereto, said housing having a like plurality of mating members situated thereon for mating a respective coupling members, said mating members and coupling members forming a like plurality of board mounts, each said mating member having spring means therein for resiliently biasing said housing toward said board, whereby, said transducer is clamped between said annular surface and said first and second electrical contacts.

9. Supporting and contacting means as in claim 8 characterized in that at least one of said coupling members is electrically connected to the respective mating member, whereby said coupling member may complete a circuit between said board member and said conductive housing.

10. Supporting and contacting means as in claim 7 characterized in that said housing has an acoustical contact member in close proximity to the edge of said transducer, said acoustical member being located to interfere with the oscillation of said transducer, whereby the transducer intermittently contacts said housing during oscillation and causes resonance of said housing.

11. Supporting and contacting means as in claim 1 characterized in that said contacts and housing are fixedly mounted to a board member, said annular surface in said housing being defined by the end of a tubular member, said tubular member being resiliently attached to said housing.

12. Supporting and mounting means as in claim 11 characterized in that said housing is made of elastic material and comprises a generally cylindrical outer portion and a top portion, said tubular member being attached to said top portion concentrically within said outer portion, said top portion having a plurality of arcuate slots therein, said slots having overlapping portions defining strips of elastic material therebetween.

13. Supporting and contacting means as in claim 12 characterized in that said cylindrical outer portion has a plurality of integral legs with latching means thereon extending parallel thereto for resiliently engaging a like plurality of holes in said board member.

14. Supporting and contacting means as in claim 13 characterized in that said plurality is at least three, said housing having a generally cylindrical inside surface with a like plurality of spacing ribs thereon, said spacing ribs being located between said legs, whereby said ribs do not interfere with said transducer as said legs are flexed for engagement with said holes in said board.

15. Supporting and contacting means as in claim 1 characterized in that said housing has a generally cylindrical inside surface with an orienting rib thereon, said rib fitting in a notch in the edge of said transducer, whereby radial orientation of said transducer relative to said housing is achieved.

16. Supporting and contacting means as in claim 1 characterized in that said housing has a generally cylindrical inside surface with a plurality of at least three spacing ribs thereon about the circumference of the transducer and spaced slightly therefrom.

17. Supporting and contacting means as in claim 16 characterized in that one of said spacing ribs is an orienting rib, said orienting rib fitting in a notch in the edge of said transducer, whereby radial orientation of said transducer relative to said housing is achieved.

18. Supporting and contacting means as in claim 1 characterized in that said contacts are mounted on a circuit board, said second surface of said transducer facing said circuit board.

* * * * *